United States Patent [19]

Blum et al.

[11] 3,996,528
[45] Dec. 7, 1976

[54] FOLDED CAVITY INJECTION LASER

[75] Inventors: Joseph Martin Blum, Yorktown Heights; Eric Gung Hwa Lean, Mahopac; James Cleary McGroddy, Putnam Valley, all of N.Y.

[73] Assignee: International Business Machines Corporation, Armonk, N.Y.

[22] Filed: Dec. 31, 1975

[21] Appl. No.: 645,738

[52] U.S. Cl. .............................. 331/94.5 H; 357/18
[51] Int. Cl.² .......................................... H01S 3/19
[58] Field of Search ..................... 331/94.5; 357/18

[56] References Cited
OTHER PUBLICATIONS

Kazarinov et al., Injection Heterojunction Laser with a Diffraction Grating on Its Contact Surface, Soviet Phys.–Semiconductors, vol. 6, No. 7 (Jan. 1973) pp. 1184–1189.

Dobkin et al., Semiconductor Laser With Local Mirrors, Soviet Phys.–Semiconductors, vol. 4, No. 3 (Sept. 1970) pp. 515–516.

*Primary Examiner*—William L. Sikes
*Attorney, Agent, or Firm*—George Baron

[57] ABSTRACT

An injection laser, which is chemically etched to provide mirror-like surfaces, also is provided with a chirped diffraction grating. The latter grating, which is etched in the injection laser, combines with the chemically etched sides to provide laser emission in a direction substantially parallel to the current flowing through the laser. As an alternative to the chirped diffraction grating, waveguides are included in the resulting folded cavity laser. Either of the above structures relaxes the fabrication tolerance in the inclined surfaces etched in the laser relative to known folded cavity lasing structures.

7 Claims, 6 Drawing Figures

FOLDED CAVITY INJECTION LASER

RELATED APPLICATIONS

A copending patent application entitled "Two-Dimensional Integrated Injection Laser Array" by James C. McGroddy, filed May 28, 1975, Ser. No. 581,454, and assigned to the assignee in the instant application. Such commonly assigned copending application modifies the geometry of the p-n junction region of a semiconductor by chemically etching that surface oriented in the (001) direction and the mutually rectangular planes being ($1\bar{1}0$) and (110) so that a 45° etch is produced.

GENERAL DESCRIPTION OF THE INVENTION

It has been discovered that etches along the (001) surface of three-five compounds produce a desirable 45° cut along that surface, so as to allow for laser emission to take place at an angle parallel to the current through the laser, but such (001) surfaces are difficult to etch accurately planar at that angle. It is easier to produce grooves, by chemical etching, with faces along <111> planes, but such <111> planes do not produce 45° cuts or planes, so that the lasing cavity cannot be folded back on itself by the planar mirror scheme described previously. Such etching of the <111> planes produces an angle of about 54.7° between the <111> and <100> planes, rather than a 45° angle, so that light reflected from the 54.7° wall is not reflected back upon itself from the bottom surface of the laser wafer.

In order to achieve the benefit of simplified etching yet retain the fold back effect, a chirped diffraction grating is etched into the laser's lower surface. This grating allows light to be reflected back onto itself even though the angle of incidence of light emanating from the etched surface onto the lower surface of the laser varies with distance along the length of that lower surface.

Thus, it is an object of this invention to attain a folded cavity effect for an array of lasers so as to permit lasing light to emanate from a p-n junction in a direction parallel to the current flowing through each p-n junction in such array.

It is yet another object to change the geometry of an injection laser so that the means for modifying the direction of light output from that laser is integral with that laser.

A further object is to modify the direction of light output from an injection laser by etching preferred planes into the crystalline compounds composing such laser.

The foregoing and other objects, features and advantages of the invention will be apparent from the following more particular description of the preferred embodiments of the invention, as illustrated in the accompanying drawings.

DESCRIPTION OF THE DRAWINGS

FIG. 1 shows a conventional double heterojunction laser. On a layer 2 of n-type GaAs are grown consecutive layers, respectively, of n-type GaAlAs 4, p-type GaAs 6, p-type GaAlAs 8 and p-type GaAs 10. When current above a threshold value from a battery 12 is sent through an electrode 14 and electrode 16, both electrodes being on opposite faces of the multilayered structure, light emanates from a facet on the p-n junction. Such p-n junction 15 lies in a plane that is perpendicular to the direct current flow from electrode 14 to electrode 16. The cavity of the laser is bounded by the two cleaved facets P and P' and the laser light is emitted from these facets in a direction approximately perpendicular to the direction of current flow. The necessary reflectivity at the cavity facets is provided by the discontinuity of the index of refraction between the semiconducting materials and air.

FIGS. 2 and 3 are schematic representations of the preferred embodiment of the present invention. The layers are grown in the same fashion as described above for FIG. 1. However, in this case etched grooves 18 with faces consisting of <111> crystal planes are etched through the top layers (4–10) of the structure. A suitable etchant is a solution of $H_2SO_4$—$H_2O_2$—$H_2O$ and the latter is made to cut grooves 18 into the laser, employing suitable protective masks, not shown, for preventing other portions of a laser from being etched. The exact details of a successful etchant for producing a groove 18 between a <111> and a <100> plane of the double heterojunction unit of FIG. 1 are described in a paper entitled "Selective Etching of Gallium Arsenide Crystals in $H_2SO_4$—$H_2O_2$—$H_2O$ System" by Shiva Ida et al., published in The Journal Electrochemical Society- Solid State Science, May 1971, pp. 768–771. One solution capable of serving as an etchant is $1H_2SO_4$—$8H_2O_2$—$1H_2O$ and another solution is $8H_2SO_4$—$1H_2O_2$—$H_2O$. In the examples chosen, the concentration of $H_2SO_4$ is a 98 percent solution by weight and the concentration of $H_2O_2$ is a 30 percent solution by weight, whereas the formula concentrations are by volume. Another publication that teaches how to achieve the desired etches in planes of GaAs, using a $Br_2$—$CH_3OH$ system for etching, is "Preferential Etching and Etched Profile of GaAs" by Yasuo Tarui et al. which appeared in The Journal Electrochemical Society-Solid State Science, January 1971, pp. 118–122.

Figure 1:
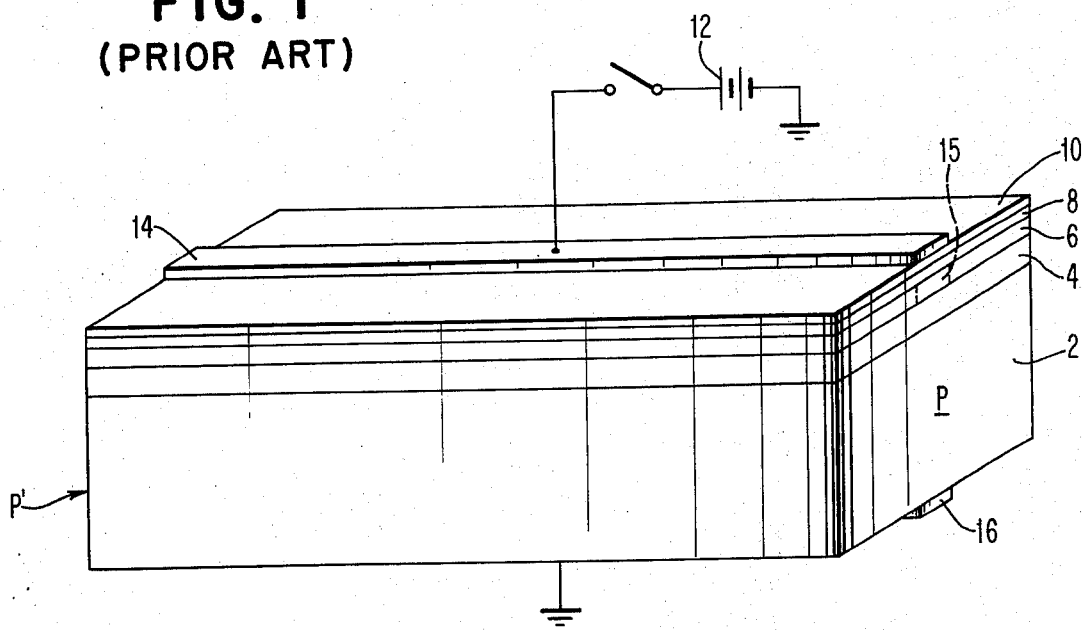
FIG. 1 shows a prior art conventional heterojunction laser.

When lasing light is emitting from the p-n junction lasing region in the vicinity of the intersection of layer 4 and layer 6, such light will impinge on a wall 20 whose angle is greater than 45° to the p-n junction plane. Consequently, a ray of light, such as ray 22, which impinges on the otherwise smooth surface 24 of substrate 2, will be reflected away from the p-n junction. Since such reflection will discourage laser oscillations from being produced some means must be provided to have ray 22 reflect back to the p-n junction, the amplifying region of the laser.

Figure 4:
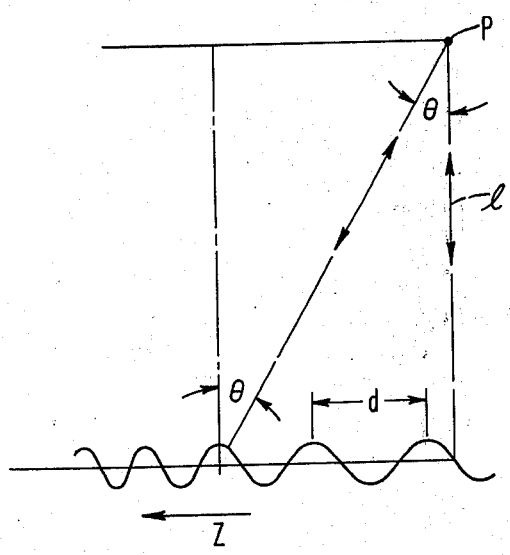
FIG. 4 is a diagram for aiding in the understanding of how a feature of the invention must be manufactured.
Figure 2:
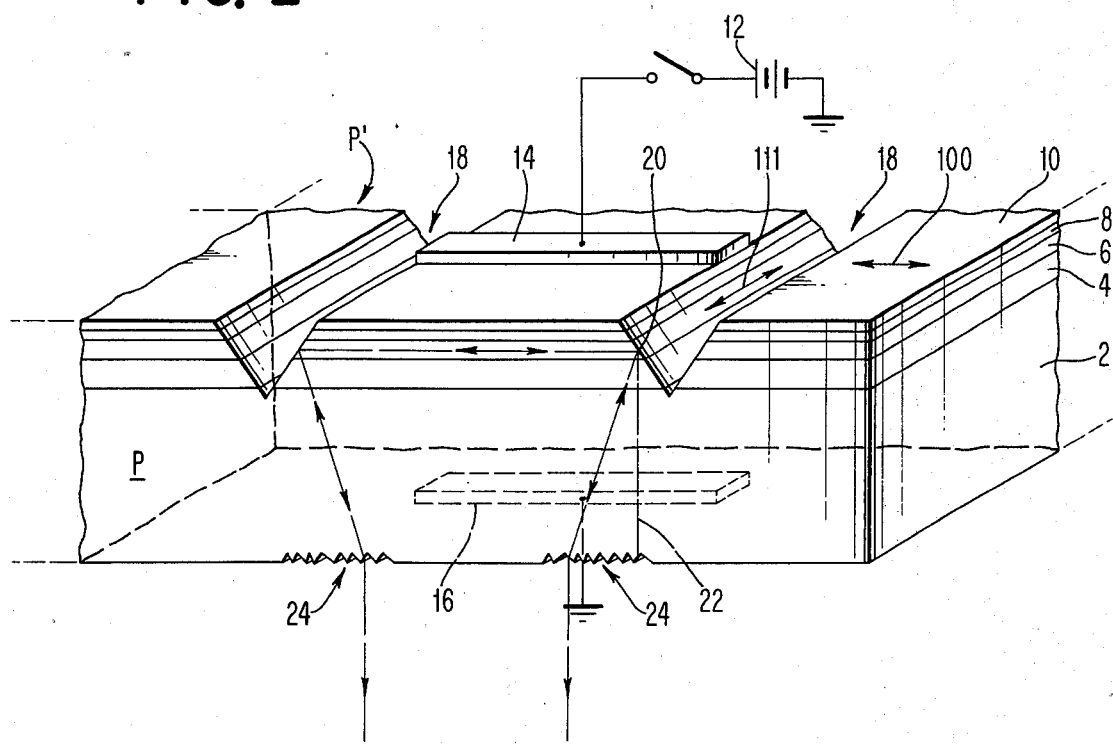
FIG. 2 is a schematic representation of a preferred embodiment of the invention.

FIG. 4 is a showing of how laser-supporting oscillations are attained. Assume the line $l$ represents the perpendicular distance that ray 22 is from the p-n junction point P to the bottom face of substrate 2. Z represents the horizontal distance along such substrate surface that such ray 22 will travel as it reflects from plane (111) that is ~ 54.7° to plane (100). To achieve reflection, the grating distance $$d(Z) = \frac{\lambda}{2Z} \sqrt{Z^2 + l^2},$$

where $l$ is the thickness of the laser from point P to the base of the substrate 2, and might typically have a value of 100 microns, and $z$ is the distance measured from a point vertically below the intersection of the active region of the laser with the plane to be etched, and $\lambda$ is the wavelength of the lasing light. Angle $\theta$ is the angle at which the central ray of light exits from point P. For GaAs, the frequency of light $\lambda$ is approximately 0.23 microns. For standard laser thicknesses, and using angle $\theta = 19.4°$, $d$ has a value of about 0.39 microns. Using standard photoresist and etching steps, a chirped grating 24 is constructed, wherein the distance $d$ between cycles gets larger as one moves further away from the intersection of line 20 with the surface to be etched. About 100 or so cycles can be etched in the chirped grating 24, if there is a grating beneath the right and left regions of the lasing cavity. The gratings 24 are also partially transmissive to lasing light, so they serve not only to support lasing oscillations, but also to provide outputs for a laser. The grooves of the etched gratings 24 may be filled with a metal or other reflecting substance to alter the properties of such gratings 24.

Figure 5:
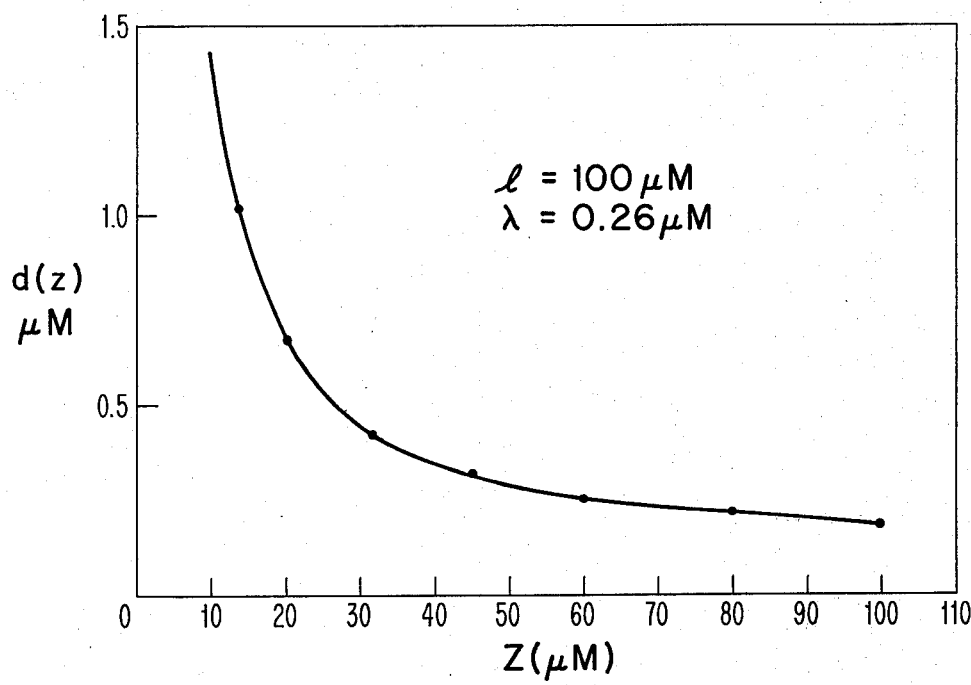
FIG. 5 is a plot of the grating spacing d as a function of distance z along the grating.
Figure 6:
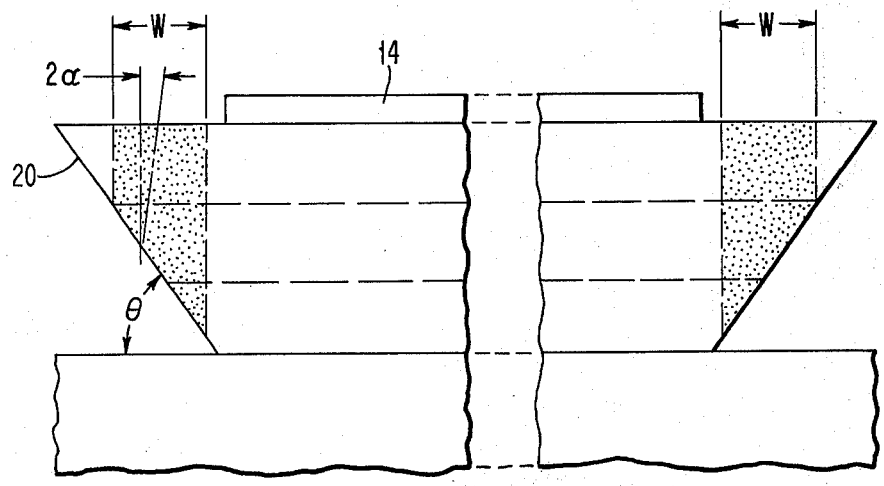
FIG. 6 is a schematic showing of a modification of the inventions of FIGS. 2 and 3 for employing a waveguide in the laser that is compatible with the folded cavity laser.

As seen in plot of FIG. 5, where $l$ is assumed to be 100 microns, the wavelength of the laser light is $\lambda = 0.26$ microns, various values of $d$ (in microns) are obtained for various distances Z in microns along the length of the chirped grating.

Figure 3:
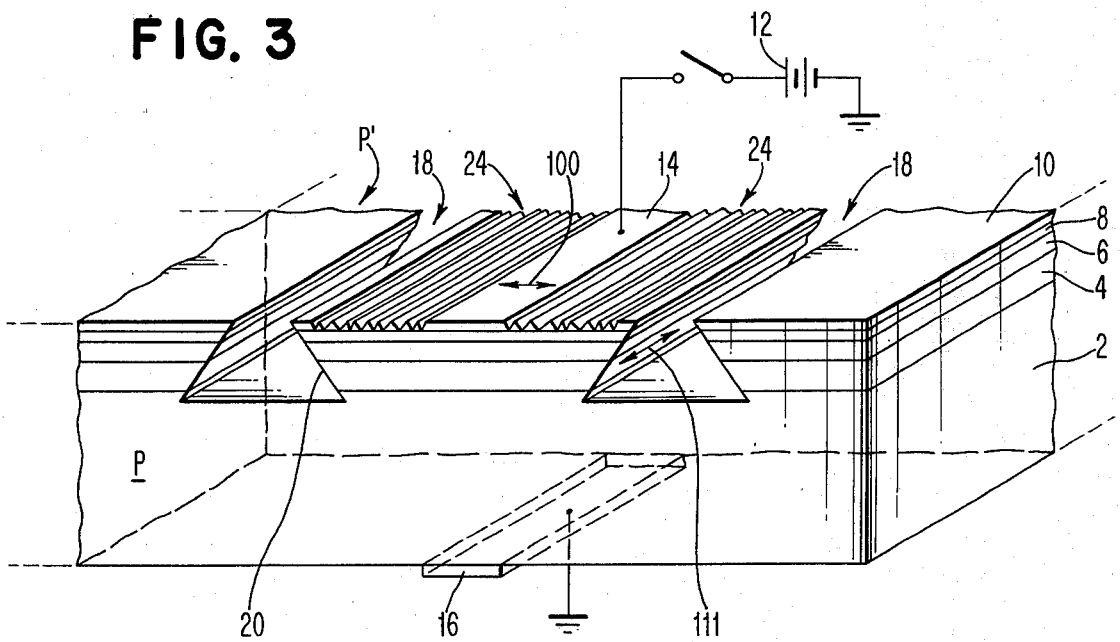
FIG. 3 is another embodiment of the invention.

FIG. 3 is a variation of the embodiment shown in FIG. 1. Instead of making the chirped grating at the bottom of GaAs substrate 2, the chirped grating 24, using the same formula $$d(Z) = \frac{\lambda}{2Z} \sqrt{Z^2 + l^2}$$

to calculate the spacings $d$ between each adjacent element of the grating, is made into the top surface of the p-type GaAs layer 10. The distance $l$ is the shortest distance measured from point P to layer 10.

The use of a chirped grating for an injection laser, such as a solid laser having GaAs as its active element, allows one to use the readily etched <111> surface for the cavity folding mirror to be etched into the GaAs crystal. Such chirped grating will enable one to obtain a folded GaAs laser without restricting one to etch only 45° planes of that GaAs crystal. In effect, the use of a chirped grating gives the laser manufacturer wider latitude in making folded cavity GaAs lasers. As an alternative to the use of the chirped diffraction grating, the shaded areas W of the folded cavity can have their index of refraction $n$ increased by an amount $\Delta n$ compared with the non-shaded portions of the laser cavity. Such change in density can be accomplished by either proton bombardment of the region or by changing the aluminum concentration of that region. The increase in n forms a waveguide which guides the light to the planar top surface of the wafer.

In order for laser light that is reflected from etched wall 20 to remain within the laser cavity, the shaded regions must act as a waveguide for the optical waves produced in the cavity. When the angle $\theta$ is greater than 45°, then the value of $\alpha$ to support waveguide action is expressed as $$\alpha \leq \sqrt{\frac{\Delta n}{2n}},$$

where $\alpha = \theta - 45°$ and $n$ is the index of refraction of the GaAs regions and $\Delta n$ is the change in index of refraction of the proton bombarded regions. For $\alpha = 9°$ and $n = 3.4$, by changing the index of refraction by an amount of 0.1678, the light in such waveguide can be trapped. Consequently, this invention envisions yet another way to relax the tolerances of fabricating the inclined surfaces of certain planes of injection lasers to achieve folded cavity lasers.

What is claimed is:

1. A folded cavity injection laser comprising a p-n junction in the body of said laser and electrodes electrically coupled to said p-n junction whereby current through said electrodes produces light emission across said p-n junction in a plane that is perpendicular to the direction of current flow through said laser, two mirror-like surfaces, integral with the body of said laser, facing each other and each disposed at an angle greater than 45° to the plane of said p-n junction so that lasing light is reflected in a direction that is not parallel to said current direction, and light diffracting means, in the body of said laser and in the path of said reflected light, for diffracting the latter into a path that returns the light to the mirror-like surfaces and hence to the p-n junction region of said laser as well as diffracting a portion of said reflected light out of the laser in a direction that is substantially parallel to current flow in said laser.

2. A folded cavity injection laser comprising a p-n junction in the body of said laser and electrodes electrically coupled to said p-n junction whereby current through said electrodes produces light emission across said p-n junction in a plane that is perpendicular to the direction of current through said laser, two mirror-like surfaces, integral with the body of said laser, facing each other and each disposed at an angle greater than 45° to the plane of said p-n junction so that lasing light is reflected in a direction that is not parallel to said current direction, and a chirped diffraction grating, on said laser, in the path of said reflected light so as to diffract the emitted light into a path that is parallel to the direction of current flow through said laser.

3. A folded cavity injection laser comprising a p-n junction in the body of said laser, said body having a top surface and a bottom surface, an electrode electrically connected to said top surface and a second electrode connected to said bottom surface whereby current through said electrodes produces light emission across said p-n junction in a plane that is perpendicular to the direction of current through said laser, two mirror-like surfaces, integral with the body of said laser, facing each other and each disposed at an angle greater than 45° to the plane of such p-n junction so that lasing light is reflected in a direction that is not parallel to said current direction, and a chirped diffraction grating on the top surface of said laser and in the path of said reflected light so as to diffract the latter into a path that is substantially parallel to the direction of current flow through said laser.

4. A folded cavity injection laser comprising a p-n junction in the body of said laser, said body having a top surface and a bottom surface, an electrode electrically connected to said top surface and a second electrode connected to said bottom surface whereby current through said electrodes produces light emmission across said p-n junction in a plane that is perpendicular to the direction of current through said laser, two mirror-like surfaces, integral with the body of said laser, facing each other and each disposed at an angle greater than 45° to the plane of such p-n junction so that lasing light is reflected in a direction that is not parallel to said current direction, and a chirped diffraction grating on the bottom surface of said laser and in the path of said reflected light so as to diffract the latter into a path that is parallel to the direction of current flow through said laser.

5. A folded cavity injection laser comprising a plurality of layers built up consecutively, namely, an n-type GaAs layer, an n-type GaAlAs layer, a p-type GaAs layer, a p-type GaAlAs layer and a p-type GaAs layer wherein the region between the n-type GaAlAs layer and p-type GaAs layer is the active region of said laser, all said layers being grown along the <100> plane, two mirror-like surfaces, etched along the <111> plane of said GaAs layers, intersecting said <100> plane at an angle greater than 45°, electrodes connected to said n-type GaAs layer and said p-type GaAs layer so that current through said electrodes will cause lasing light across said active region to be reflected by said surfaces in a direction that is not parallel to said current flow through said laser, and a chirped diffraction grating on the p-type GaAs layer of said laser and in the path of said reflected light so as to diffract the latter into a path that is parallel to the direction of current flow through said laser.

6. A folded cavity injection laser comprising a plurality of layers built up consecutively, namely, an n-type GaAs layer, an n-type GaAlAs layer, a p-type GaAs layer, a p-type GaAlAs layer and a p-type GaAs layer wherein the region between the n-type GaAlAs layer and p-type GaAs layer is the active region of said laser, all said layers being grown along the <100> plane, two mirror-like surfaces, etched along the <111> plane of said GaAs layers, intersecting said <100> plane at an angle greater than 45°, electrodes connected to said n-type GaAs layer and said p-type GaAs layer so that current through said electrodes will cause lasing light across said active region to be reflected by said surfaces in a direction that is not parallel to said current flow through said laser, and a chirped diffraction grating on the n-type GaAs layer of said laser and in the path of said reflected light so as to diffract the latter into a path that is parallel to the direction of current flow through said laser.

7. A folded cavity injection laser comprising a p-n junction in the body of said laser and electrodes electrically coupled to said p-n junction whereby current through said electrodes produces light emission across said p-n junction in a plane that is perpendicular to the direction of current flow through said laser, two mirror-like surfaces, integral with the body of said laser, facing each other and each disposed at an angle greater than 45° to the plane of said p-n junction so that lasing light is reflected in a direction that is not parallel to said current direction, and a portion of the body of said laser lying within the path of said reflected laser light and having an index of refraction different than the index of refraction of the remaining portion of said laser so that said reflected laser light will be diffracted into a path that is parallel to the direction of current flow through said laser.

* * * * *